US008842860B2

(12) United States Patent
Jang et al.

(10) Patent No.: US 8,842,860 B2
(45) Date of Patent: Sep. 23, 2014

(54) APPARATUS AND METHOD FOR OUTPUTTING SOUND IN MOBILE TERMINAL

(75) Inventors: Ji Sang Jang, Bucheon-si (KR); Chul Hyo Yoon, Suwon-si (KR); Jae Woon Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 419 days.

(21) Appl. No.: 13/040,055

(22) Filed: Mar. 3, 2011

(65) Prior Publication Data

US 2011/0216929 A1 Sep. 8, 2011

(30) Foreign Application Priority Data

Mar. 3, 2010 (KR) ........................ 10-2010-0019074

(51) Int. Cl.
*H04R 25/00* (2006.01)
*H03F 99/00* (2009.01)

(52) U.S. Cl.
USPC ............................ 381/312; 381/321; 381/120

(58) Field of Classification Search
USPC .................. 381/312, 321, 315, 74, 79, 81, 60
See application file for complete search history.

(56) References Cited

U.S. PATENT DOCUMENTS 5,721,783 A * 2/1998 Anderson ..................... 381/328
6,009,311 A * 12/1999 Killion et al. ................ 455/63.1
7,317,932 B2 * 1/2008 Lai et al. .................... 455/556.1

* cited by examiner

*Primary Examiner* — Curtis Kuntz
*Assistant Examiner* — Sunita Joshi

(57) ABSTRACT

An apparatus and method for outputting a sound with Hearing Aids Compatibility (HAC) in a mobile terminal. The sound output apparatus includes a modem chip including a first amplifier amplifying and transferring an electric signal to a switch, a switch that selectively connects an output line of the first amplifier to a receiver or a second amplifier, a second amplifier connected with the receiver and the switch and that amplifies and transfers an electric signal received from the first amplifier to the receiver when the switch connects the output line of the first amplifier to the second amplifier, and a receiver connected with the switch and the second amplifier and that converts and outputs an electric signal received from the first amplifier or the second amplifier into a sound. This allows for the stable transfer of a sound to hearing handicapped persons with HAC without distortion of the sound quality.

20 Claims, 5 Drawing Sheets

APPARATUS AND METHOD FOR OUTPUTTING SOUND IN MOBILE TERMINAL

CROSS-REFERENCE TO RELATED APPLICATION(S) AND CLAIM OF PRIORITY

The present application claims the benefit under 35 U.S.C. §119(a) to a Korean patent application filed in the Korean Intellectual Property Office on Mar. 3, 2010 and assigned Serial No. 10-2010-0019074, the entire disclosure of which is hereby incorporated by reference.

TECHNICAL FIELD OF THE INVENTION

The present invention relates to a sound outputting apparatus in a mobile terminal and a method thereof, and more particularly, to an apparatus for outputting a sound with Hearing Aids Compatibility (HAC) in a mobile terminal, and a method thereof.

BACKGROUND OF THE INVENTION

In recent years, with the rapidly increasing supply of mobile terminals, it has become a modern person's necessity. Since the mobile terminal can provide not only a unique voice call service, but also all types of data transmission service, and various additional services, it may serve as a multimedia communication device. Recently, a mobile terminal with HAC for hearing handicapped persons has been developed.

The mobile terminal with HAC is managed according to an HAC standard. The HAC standard includes items such as intensity, Signal to Noise Ratio (SNR), and Frequency Response. When the mobile terminal satisfies given conditions requiring the foregoing items, the performance thereof can be recognized as a mobile terminal for HAC. In an embodiment, SNR among them is classified into a T-Category grade of T1 to T4 according to sound signal intensity and noise degree. When the mobile terminal has a grade T3 or T4, a performance thereof can be recognized as a mobile terminal for HAC.

To improve SNR, the related art increases a gain of a receiver dedicated amplifier in a modem chip of the mobile terminal. In general, because the receiver dedicated amplifier in the modem chip has a relatively small output, when a gain is extremely increased, signal intensity is increased but the quality of sound is distorted. When the quality of sound is distorted, a hearing handicapped person wearing a hearing aid cannot adequately hear a sound.

SUMMARY OF THE INVENTION

To address the above-discussed deficiencies of the prior art, it is a primary object to provide an apparatus for outputting a sound in a mobile terminal for HAC stably amplifying and outputting a sound without distortion of the sound quality, and a method thereof.

In accordance with an aspect of the present invention, a sound output apparatus includes a modem chip including a first amplifier configured to amplify and transfer an electric signal to a switch. The sound output apparatus also includes the switch configured to selectively connect an output line of the first amplifier to a receiver or a second amplifier. The sound output apparatus also includes the second amplifier connected with the receiver and the switch, and configured to amplify and transfer an electric signal received from the first amplifier to the receiver when the switch connects the output line of the first amplifier to the second amplifier. The sound output apparatus further includes the receiver connected with the switch and the second amplifier, and configured to convert and output an electric signal received from the first amplifier or the second amplifier into a sound.

In accordance with another aspect of the present invention, a sound output method of a sound output apparatus including a switch electrically connecting an output line of a first amplifier to a second amplifier or a receiver is provided. The method includes checking whether a Hearing Aids Compatibility (HAC) mode is set to 'ON' or 'OFF'. The method also includes controlling the switch to connect the output line of the first amplifier to the second amplifier when the HAC mode is set to 'ON'. The method further includes controlling the first amplifier to amplify and transfer an electric signal to the second amplifier when a sound output command is input. The method further includes controlling the second amplifier to amplify and transfer the electric signal to a receiver. The method also includes controlling the receiver to convert and output the electric signal into a sound.

The present invention may stably transfer a sound to hearing handicapped persons with HAC without distortion of the sound quality. In addition, when determining a T-Category grade of a mobile terminal for HAC, it can acquire a higher grade.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged mobile terminal. Detailed descriptions of well-known functions and structures incorporated herein may be omitted to avoid obscuring the subject matter of the present invention.

The present invention describes a mobile terminal by way of example. However, the present invention is not limited thereto. That is, the present invention may be applicable to all devices outputting a sound. Further, a mobile terminal according to an embodiment of the present invention is a terminal capable of outputting a sound. The mobile terminal may preferably be a mobile communication terminal, a Portable Multimedia Player (PMP), a Personal Digital Assistant (DA), Smart Phone, or MP3 player.

When the mobile terminal is a mobile communication terminal, it may be an International Mobile Telecommunication 2000 (IMT-2000) terminal, Wideband Code Division Multiple Access (WCDMA) terminal, Global System For Mobile Communication/General Packet Radio Service (GSM/GPRS) terminal, or Universal Mobile Telecommunication Service (UMTS) terminal.

As used herein, the term "sound" means an audible sound that a person can hear. The sound is created by vibration of a vibration plate and output by a receiver or a speaker. As used herein, the term "sound signal" means an electric signal converted from the "sound". The receiver or the speaker receives a sound signal, and converts and outputs the received sound signal into a sound.

Figure 1:
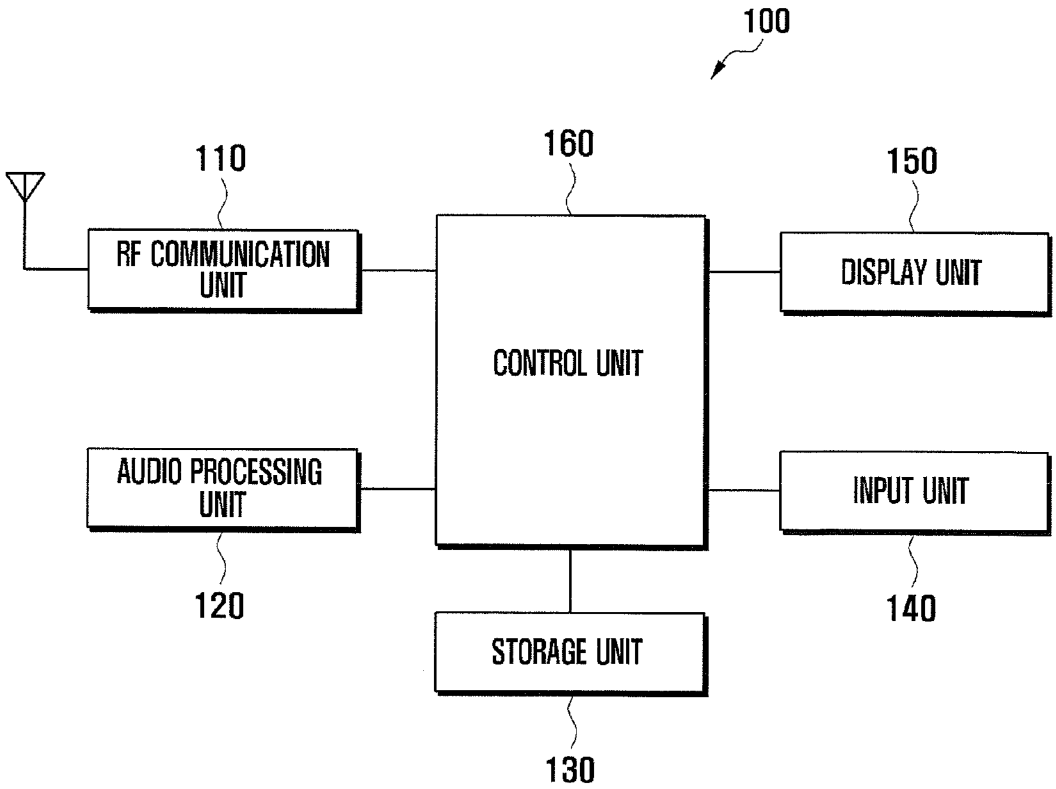
FIG. 1 illustrates a configuration of a mobile terminal with a sound output apparatus according to an embodiment of the present invention.

FIG. 1 is a block diagram illustrating a configuration of a mobile terminal 100 with a sound output apparatus according to an embodiment of the present invention.

The mobile terminal 100 includes a radio frequency (RF) communication unit 110, an audio processing unit 120, a storage unit 130, an input unit 140, a display unit 150, and a control unit 160.

The RF communication unit performs transmitting and receiving functions of corresponding data for RF communication of the mobile terminal. The RF communication unit 110 may include an RF transmitter (not shown) up-converting a frequency of a transmitted signal and amplifying the signal, and an RF receiver (not shown) low-noise-amplifying a received signal and down-converting the signal. Moreover, the RF communication unit 110 may receive data through an RF channel and output it to the control unit 160. The RF communication unit 110 may transmit data provided from the control unit 160 through the RF channel.

The audio processing unit 120 may include a CODEC. The CODEC can be configured by a data CODEC processing packet data and an audio CODEC processing an audio signal such as a sound. The audio processing unit 120 converts a digital audio signal into an analog audio signal through the audio CODEC, and outputs the converted analog audio signal through a receiver or a speaker. The audio processing unit converts an analog audio signal provided from a microphone (MIC) into a digital audio signal through the audio CODEC. The audio processing unit 120 constitutes a sound output apparatus of the present invention. Structural elements of the audio processing unit 120 will be explained in detail with reference to FIG. 2.

The storage unit 130 stores programs and data necessary for an operation of the mobile terminal 100, and can be divided into a program area and a data area. The storage unit 130 can be configured by a volatile storage medium, a nonvolatile storage medium, or a combination thereof. The volatile storage medium includes a semiconductor memory such as RAM, DRAM, or SRAM. The nonvolatile storage medium may include a hard disk.

The input unit 140 receives user key operation signals for controlling the mobile terminal 100 and transfers them to the control unit 160.

The input unit 140 can be configured by either a key pad such as 3*4 keyboard or Qwerty keyboard including numeral keys, character keys, and arrow keys or a touch panel. The mobile terminal 100 may include a button key, a jog key, and a wheel key besides the key pad or the touch panel. The input unit 140 generates and transfers input signals executing functions (call function, moving image function, music play function, image display function, or camera photographing function) to the control unit 160. In the present invention, when a user selects an HAC mode as 'ON' or 'OFF' using the input unit 140, the input unit 140 generates and transfers an input signal corresponding to a user selection to the control unit 160.

The display unit 150 can be configured as Liquid Crystal Display (LCD), Organic Light Emitting Diodes (OLED), or Active Matrix Organic Light Emitting Diodes (AMOLED). The display unit 150 visibly provides menus, input data, function setting information, and various other information of the mobile terminal 100 to a user. The display unit 150 outputs a booting screen, an idle screen, a menu screen, a call screen, and other application screens of the mobile terminal 100. The display unit 150 according to an embodiment of the present invention may display a menu screen selecting an HAC mode as 'ON' or 'OFF'. The user may view the menu screen using the input unit 140 and set the HAC mode to 'ON' or 'OFF'.

The control unit 160 controls an overall operation of the mobile terminal 100 and signal flow between internal blocks of the mobile terminal 100. The control unit 160 according to an embodiment of the present invention controls the audio processing unit 120 to output a sound. The control unit 160 includes structural elements configuring the sound output apparatus of the present invention. The structural elements of the control unit 160 will be explained in detail with reference to FIG. 2.

Figure 2:
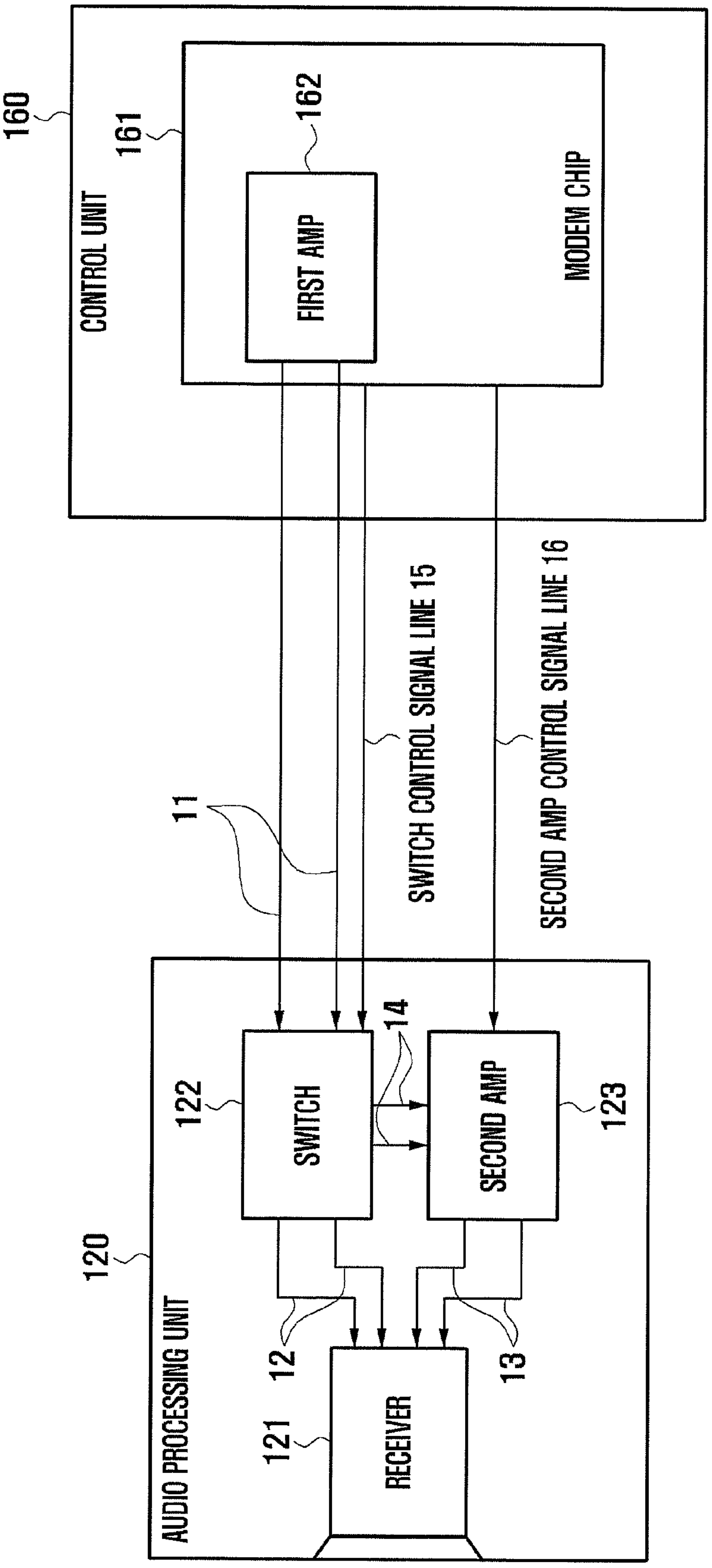
FIG. 2 illustrates an audio processing unit and a control unit that are structural elements of a sound output apparatus according to an embodiment of the present invention.

FIG. 2 is a block diagram illustrating an audio processing unit 120 and a control unit 160 that are structural elements of a sound output apparatus according to an embodiment of the present invention.

The audio processing unit 120 according to an embodiment of the present invention includes a receiver 121, a switch 122, and a second amplifier 123. The control unit 160 includes a modem chip 161. The modem chip 161 includes a first amplifier 162. FIG. 2 shows that a receiver 121, a switch 122, and a second amplifier 123 are included in a block differing from that of the modem chip 161. However, the present invention is not limited thereto. The receiver 121, the switch 122, the second amplifier 123, and the modem chip 161 can be configured as one block in the sound output apparatus.

The receiver 121 is a device converting a sound signal that is an electric signal into a sound. When an electric signal with various frequencies is applied to a voice coil included in the receiver 121, it generates mechanical energy according to electrical intensity and frequency, and generates vibration at a vibration plate attached to the voice coil to generate sound pressure recognized by human's ears. The receiver 121 may be a HAC special receiver with a 'T-COIL' or a general receiver. The 'T-COIL' is a coil included in the voice coil that amplifies the sound pressure generated by the voice coil. The 'T-COIL' according to an embodiment may enclose a wound periphery of a voice coil in a disc shape.

Moreover, the receiver according to an embodiment of the present invention may be a speaker combined receiver. The speaker combined receiver can selectively act as a receiver or a speaker. Further, the receiver 121 may include a headset such as a wired headset or a Bluetooth headset. In this embodiment, the receiver is provided at an area contacting with the human's ear in a headset. When the receiver 121 is configured to be included in the Bluetooth headset, the portable terminal 100 further includes a Bluetooth communication module (not shown). The control unit 160 controls the Bluetooth communication module to transmit a sound signal to the Bluetooth headset. A receiver 121 included in the Bluetooth headset converts a sound signal into a sound, and outputs the sound.

The switch 122 selectively connects a sound signal received from the modem chip 161 to a receiver 121 or a second amplifier 123. The switch 122 operates under the control of the control unit 160. When an HAC mode is set to 'ON', the switch 122 connects a fourth sound signal line 14 to a first signal line 11 to connect the first amplifier 162 to the second amplifier 123. When the HAC mode is set to 'OFF', the switch 122 connects a second sound signal line 12 to the first signal line 11 to connect the first amplifier 162 to the receiver 121. An 'HAC mode' of the present invention is a mode that outputs a sound suitable for a hearing aid user. A sound in a HAC mode of an 'ON' state is amplified and output larger in comparison with that in a HAC mode of an 'OFF' state. The user sets the HAC mode to 'ON' using a hearing aid, and sets the HAC mode to 'OFF' in a general call.

The second amplifier 123 amplifies a sound signal received from the first amplifier 162. The second amplifier 123 according to an embodiment of the present invention can be configured by an audio amplifier such as a speakerphone amplifier, which may be analog amplifier or a digital amplifier. In one embodiment, the second amplifier 123 is an amplifier that exhibits higher efficiency and lower noise than a first amplifier 162 being a private use of a receiver.

The control unit 160 can be configured in a single chip form constructed by a modem chip 161. The control unit 160 may be also configured in a multi-chip form constructed by an application processor chip to control the modem chip 161 and an application. The modem chip 161 according to an embodiment of the present invention includes a first amplifier 162. The first amplifier 162 according to the present invention is a receiver dedicated amplifier. In one embodiment, the first amplifier 162 exhibits smaller intensity than that of a maximum output of the second amplifier 123.

Referring to FIG. 2, the receiver 121 connects with the switch 122 through the second sound signal line 12. The receiver 121 connects with the second amplifier 123 through the third sound signal line 13. The receiver 121 receives a sound signal from the switch 122 or the second amplifier 123, and converts and outputs the received sound signal into a sound.

The switch 122 connects with the first amplifier 162 through the first sound signal line 11. The switch 122 connects with the receiver 121 through the second sound signal line 12. The switch 122 connects with the second amplifier 123 through the fourth sound signal line 14. Further, the switch 122 connects with the modem chip 161 through a switch control signal line 15. The switch 122 receives a control signal from the modem chip 161 through the switch control signal line 15. The switch 122 selectively connects the first sound signal line 11 to the second sound signal line 12 or the fourth sound signal line 14 according to the received control signal. When the switch 122 connects the first sound signal line 11 to the second sound signal line 12, the first amplifier 162 connects with the receiver 121 and transfers an amplified sound signal by the first amplifier 162 to the receiver 121. When the switch 122 connects the first sound signal line 11 with the fourth sound signal line 14, the first amplifier 162 connects with the second amplifier 123, and controls the second amplifier 123 to again amplify the sound signal amplified by the first amplifier 162, and transfers the amplified sound signal to the receiver 121.

The second amplifier 123 connects with the receiver 121 through the third sound signal line 13, and connects with the switch 122 through the fourth sound signal line 14. Further, the second amplifier 123 connects with the modem chip 161 through a second amplifier control signal line 16. The second amplifier 123 operates under the control of the modem chip 161. When the switch 122 connects the first sound signal line 11 with the fourth sound signal line 14, the second amplifier 123 connects with the first amplifier 162. When the second amplifier 123 receives a sound signal from the switch 122, it amplifies the sound signal and transfers the amplified sound signal to the receiver 121 through the third sound signal line 13.

The first amplifier 162 connects with the switch 122 through the first sound signal line 11, and operates under the control of the modem chip 161. The first amplifier 162 amplifies a sound signal under the control of the modem chip 161 and transfers the amplified sound signal to the switch 122.

The modem chip 161 connects with the switch 122 through a switch control signal line 15, and controls the switch 122 to connect a first sound signal line 11 to one of the second sound signal line 12 or the fourth sound signal line 14. Moreover, the modem chip 161 connects with the second amplifier 123 through the second amplifier control signal line 16, and controls the second amplifier 123 to amplify a sound signal and to transfer the amplified sound signal to the receiver 121. In this situation, the modem chip 161 controls the second amplifier 123 to amplify the sound signal such that a sound of suitable intensity is transferred to a hearing aid.

The receiver 121, the switch 122, the second amplifier 123, the modem chip 161, the first amplifier 121, the first to fourth sound signal lines 11, 12, 13, 14, the switch control signal line 15, and the second amplifier control signal line 16 may be structural elements configuring a sound output apparatus of the present invention.

Furthermore, the mobile terminal 100 may include a configuration in which a switch 122 and the second amplifier 123 are included in the control unit 160.

The foregoing embodiment has described a configuration of a sound output apparatus of a mobile terminal 100 according to an embodiment of the present invention. Hereinafter, a sound output method according to an embodiment of the present invention will be explained.

Figure 3:
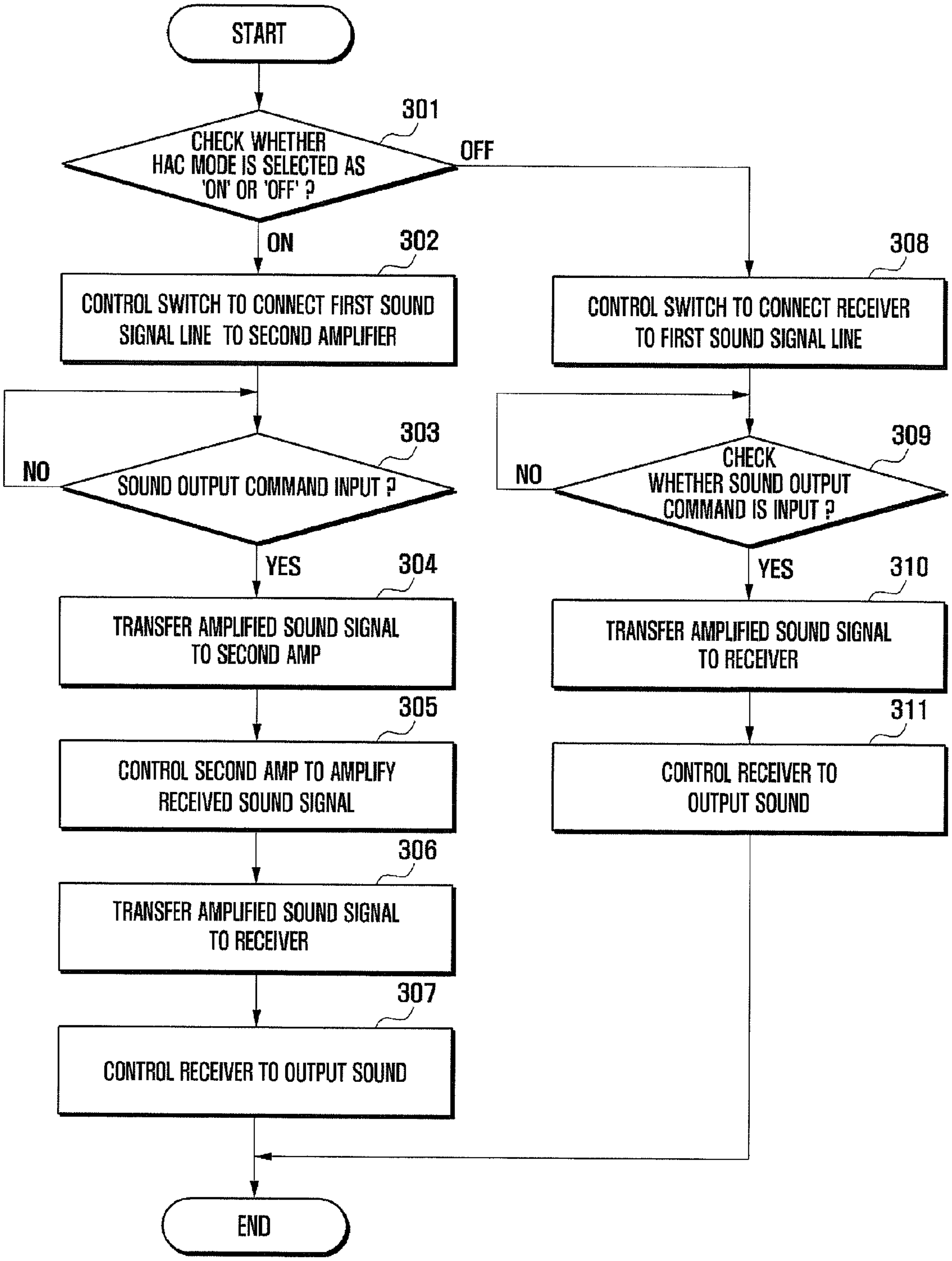
FIG. 3 illustrates a sound output method according to an embodiment of the present invention.

FIG. 3 is a flowchart illustrating a sound output method according to an embodiment of the present invention.

In FIG. 3, it is assumed that the control unit 160 is configured by a modem chip 161. It is assumed that a menu setting an HAC mode to 'ON' or 'OFF' is included in the mobile terminal 100. The HAC mode can be previously set to 'ON' or 'OFF'. When the HAC mode is set to 'ON', the switch 122 maintains a connected state between the first sound signal line 11 and the second sound signal line 12. When the HAC mode is set to 'OFF', the switch 122 maintains a connected state between the first sound signal line 11 and the fourth sound signal line 14.

The modem chip 161 controls an input unit 141 to check whether an HAC mode is selected as 'ON' or 'OFF' by a user (block 301). In detail, the modem chip 161 may control a display unit 150 to display an HAC mode setting menu screen. The HAC mode setting menu screen may include an input window setting an HAC mode to 'ON' or 'OFF'. A user may identify the HAC mode setting menu screen displayed on a display unit 150 and set an HAC mode to 'ON' or 'OFF' using the input unit 140.

When the user selects an HAC mode as 'ON', the modem chip 161 controls the switch 122 to connect the first sound signal line 11 to a second amplifier 123 (block 302). In detail, the modem chip 161 transfers a control signal including a command connecting the fourth sound signal line 14 to the first sound signal line 11 through the switch control signal line 15. The switch 122 receives a control signal from the modem chip 161. When the first sound signal line 11 and the second sound signal line 12 are connected to each other, the switch 122 blocks the connection between the first sound signal line 11 and the sound signal line 12, and connects the first sound signal line 11 to the fourth sound signal line 14. If the first sound signal line 11 is connected to the fourth sound signal line 14, the modem chip 161 maintains a connected state of the switch 122.

The modem chip 161 controls the input unit 140 or the RF communication unit 110 to check whether a sound output command is input (block 303). In an embodiment of the present invention, when the modem chip 161 receives an RF signal including another call user's sound through the RF communication unit 110, it may determine that the sound output command is input.

The modem chip 161 amplifies a sound signal by the first amplifier 162 and transfers the amplified sound signal to the second amplifier 123 through the first sound signal line 11 and the fourth sound signal line 14 (block 304). The modem chip 161 controls the second amplifier 123 to amplify a received sound signal (block 305). The modem chip 161 transfers a control signal to the second amplifier 123 through the second amplifier control signal line 16. When the second amplifier 123 receives the control signal, it amplifies a sound signal according to the received control signal. The modem chip 161 controls the second amplifier 123 to transfer the amplified sound signal to the receiver 121 (block 306). Next, the modem chip 161 controls the receiver 121 to convert and output the sound signal into a sound (block 307).

Figure 4:
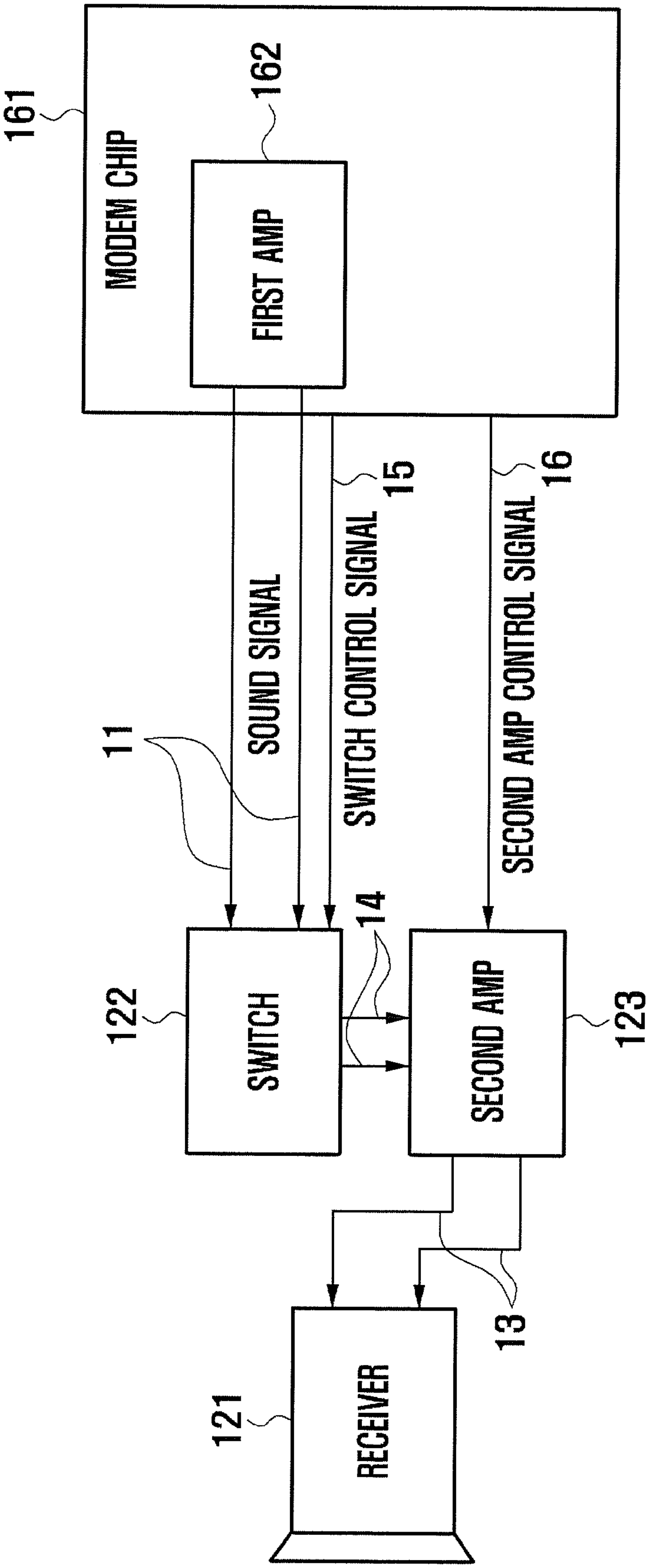
FIG. 4 illustrates a transfer procedure of a sound signal when an HAC mode is set to 'ON' in the sound output apparatus according to an embodiment of the present invention.

FIG. 4 is a block diagram illustrating a transfer procedure of a sound signal when a HAC mode is set to 'ON' in the sound output apparatus according to an embodiment of the present invention.

In FIG. 4, the modem chip 161 transfers a switch control signal to the switch 122 through the switch control signal line 150, thereby controlling the switch 122 to connect the first sound signal line 11 to the fourth sound signal line 14. The first amplifier 162 transfers a sound signal to the switch 122 through a first sound signal line 11, and the switch 122 transfers a sound signal to the second amplifier 123 through the fourth sound signal line 14. The modem chip 161 transfers a second amplifier control signal to the second amplifier 123 through a second amplifier control signal line 16. The second amplifier 123 amplifies a sound signal according to a control signal, and transfers the amplified sound signal to the receiver 121 through a third sound signal line 13.

When the HAC mode is set to 'ON', the sound signal is amplified once again by a second amplifier 123 exhibiting high efficiency and low noise. Accordingly, a hearing aid user can hear a stable sound with non-distorted sound equality.

When a user selects the HAC mode as 'OFF' in block 301, the modem chip 161 controls a switch 122 to connect a receiver 121 to the first sound signal line 11 (block 308). In detail, the modem chip 161 transfers a control signal including a command connecting the first sound signal line 11 to the second sound signal line 12 to the switch 122. When the first sound signal line 11 is previously connected to the second signal line 12, the modem chip 161 maintains a connection state of the switch 122. If the first sound signal line 11 is connected to the fourth sound signal line 14, the modem chip 161 controls the switch 122 to connect the first sound signal line 11 to the second sound signal line 12.

When the modem chip 161 determines that the sound output command is input in block 309, it controls the first amplifier 162 to amplify the sound signal and transfer the amplified sound signal to the receiver 121 through the first sound signal line 11 and the second sound signal line 12 (block 310). The sound signal transferred to the receiver 121 is a sound signal amplified by the first amplifier 162. Subsequently, the modem chip 161 controls the receiver 121 to convert and output the sound signal into a sound (block 311).

Figure 5:
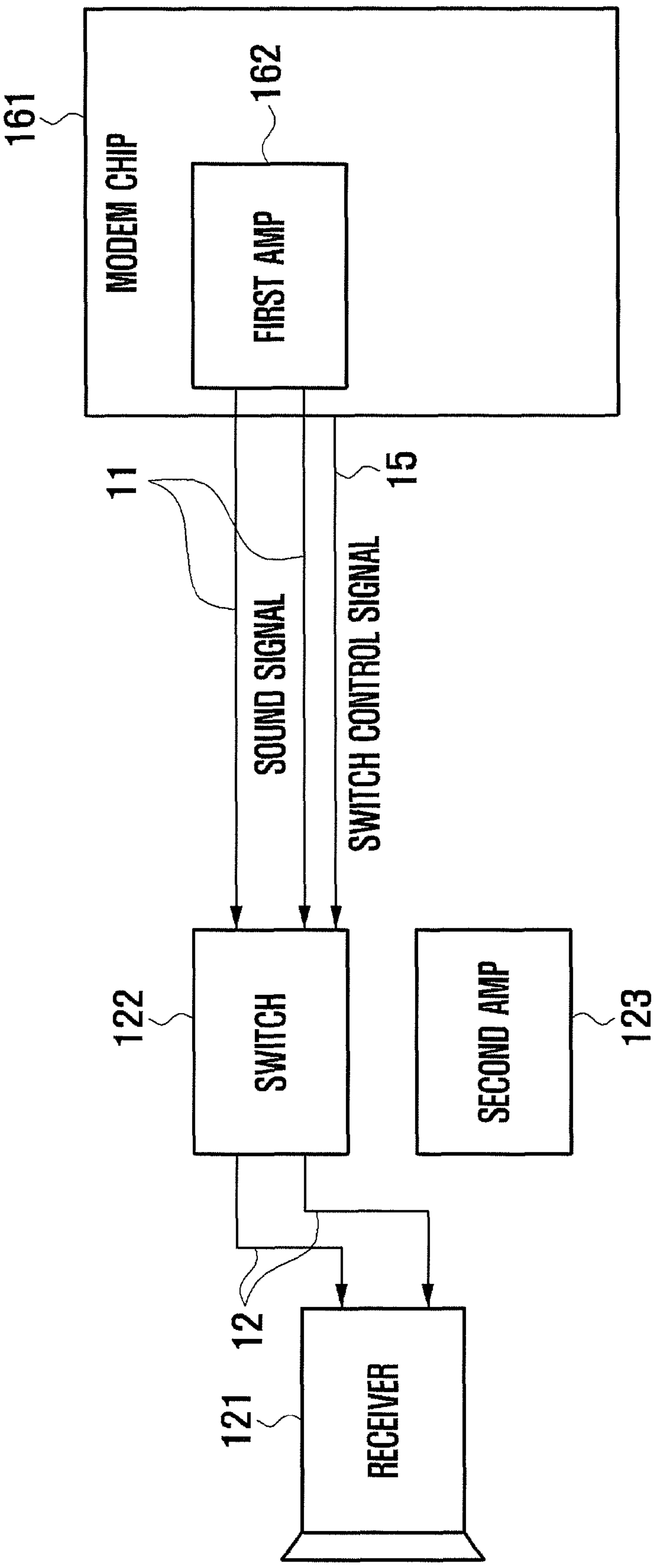
FIG. 5 illustrates a transfer procedure of a sound signal when an HAC mode is set to 'OFF' in the sound output apparatus according to an embodiment of the present invention.

FIG. 5 is a block diagram illustrating a transfer procedure of a sound signal when a HAC mode is set to 'OFF' in the sound output apparatus according to an embodiment of the present invention.

Referring to FIG. 5, the modem chip 161 transfers a switch control signal to the switch 122 through the switch control signal line 150 to control the switch 122 to connect the first sound signal line 11 to the second sound signal line 12. Further, the first amplifier 162 transfers a sound signal to the switch through the first sound signal line 11, and the switch 122 transfers the sound signal to the receiver 121 through the second sound signal line 12.

A general user sets an HAC mode to 'OFF' using the mobile terminal 100. In this situation, an SNR is not required to conform to an HAC standard, and it is sufficient that the sound signal is amplified by the first amplifier 162. A general user as well as a hearing aid user can use the mobile terminal 100 by setting the HAC mode to 'OFF'.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A sound output apparatus, comprising:

a modem chip comprising a first amplifier configured to amplify and transfer an electric signal to a switch;

the switch configured to selectively connect an output line of the first amplifier to a receiver or a second amplifier;

the second amplifier connected with the receiver and the switch, and configured to amplify and transfer the electric signal received from the first amplifier to the receiver when the switch connects the output line of the first amplifier to the second amplifier; and the receiver configured to output the electric signal received from the first amplifier or the second amplifier.

2. The sound output apparatus of claim 1, wherein the modem chip is connected with the switch through a first control line, and controls the switch to selectively connect the output line of the first amplifier to the receiver or the second amplifier.

3. The sound output apparatus of claim 2, wherein the modem chip is connected with the second amplifier through a second control line, and controls the second amplifier to amplify the electric signal received from the first amplifier.

4. The sound output apparatus of claim 1, wherein the modem chip is configured to:
- check whether a Hearing Aids Compatibility (HAC) mode is set to 'ON' or 'OFF';
- control the switch to connect the output line of the first amplifier to the second amplifier when the HAC mode is set to 'ON'; and
- control the switch to connect the output line of the first amplifier to the receiver when the HAC mode is set to 'OFF'.

5. The sound output apparatus of claim 4, wherein the modem chip is configured to control the second amplifier through a second control signal line to amplify the electric signal received from the first amplifier when the HAC mode is set to 'ON'.

6. The sound output apparatus of claim 3, wherein the second amplifier is connected with the receiver through a first sound signal line.

7. The sound output apparatus of claim 6, wherein the second amplifier is connected with the switch through a second sound signal line.

8. A method for sound output at a sound output apparatus including a switch electrically connecting an output line of a first amplifier to a second amplifier or a receiver, the method comprising:
- determining whether a Hearing Aids Compatibility (HAC) mode is set to 'ON'or 'OFF';
- connecting the output line of the first amplifier to the second amplifier at the switch when the HAC mode is set to 'ON';
- amplifying and transferring the electric signal to the second amplifier at the first amplifier when a sound output command is input;
- amplifying and transferring the electric signal to a receiver at the second amplifier; and
- outputting the electric signal at the receiver.

9. The method of claim 8, further comprising:
- connecting the output line of the first amplifier to the receiver at the switch when the HAC mode is set to 'ON';
- amplifying and transferring an electric signal to the receiver amplifier at the first amplifier when the sound output command is input; and
- outputting the electric signal at the receiver.

10. The method of claim 9, wherein the first amplifier is connected with the switch through a first sound signal line.

11. The method of claim 10, wherein the second amplifier is connected with the receiver through a second sound signal line.

12. The method of claim 11, wherein the second amplifier is connected with the switch through a third sound signal line.

13. A sound output apparatus, comprising:
- a control unit comprising a modem chip, the modem chip comprising a first amplifier configured to amplify and transfer an electric signal to a switch; and
- an audio processing unit comprising a receiver, the switch, and a second amplifier,
- wherein the switch is configured to selectively connect an output line of the first amplifier to the receiver or the second amplifier,
- wherein the second amplifier is connected with the receiver and the switch and configured to amplify and transfer the electric signal received from the first amplifier to the receiver when the switch is connected the output line of the first amplifier to the second amplifier, and
- wherein the receiver is configured to output an electric signal received from the first amplifier or the second amplifier.

14. The sound output apparatus of claim 13, wherein the modem chip is connected with the switch through a first control line, and controls the selective connection of the output line of the first amplifier to the receiver or the second amplifier by the switch.

15. The sound output apparatus of claim 14, wherein the modem chip is connected with the second amplifier through a second control line, and controls amplification of the electric signal received from the first amplifier by the second amplifier.

16. The sound output apparatus of claim 13, wherein the modem chip is configured to:
- determine whether a Hearing Aids Compatibility (HAC) mode is set to 'ON'or 'OFF';
- control connection of the output line of the first amplifier to the second amplifier by the switch when the HAC mode is set to 'ON'; and
- control connection of the output line of the first amplifier to the receiver by the switch when the HAC mode is set to 'OFF'.

17. The sound output apparatus of claim 16, wherein the modem chip is configured to control the second amplifier through a second control signal line to amplify the electric signal received from the first amplifier when the HAC mode is set to 'ON'.

18. The sound output apparatus of claim 15, wherein the second amplifier is connected with the receiver through a first sound signal line.

19. The sound output apparatus of claim 18, wherein the second amplifier is connected with the switch through a second sound signal line.

20. The sound output apparatus of claim 15, wherein the second amplifier is connected with the receiver through a third control line.

* * * * *